United States Patent [19]

Candy et al.

[11] 4,006,475
[45] Feb. 1, 1977

[54] DIGITAL-TO-ANALOG CONVERTER WITH DIGITALLY DISTRIBUTED AMPLITUDE SUPPLEMENT

[75] Inventors: James Charles Candy, Convent Station; Stanley Leon Freeny, Middletown; William Herbert Ninke, Holmdel, all of N.J.

[73] Assignee: Bell Telephone Laboratories, Incorporated, Murray Hill, N.J.

[22] Filed: July 18, 1975

[21] Appl. No.: 597,087

Related U.S. Application Data

[63] Continuation of Ser. No. 421,678, Dec. 4, 1973, abandoned.

[52] U.S. Cl. ............................................ 340/347 DA
[51] Int. Cl.² ........................................ H03K 13/02
[58] Field of Search ............ 340/347 DA; 235/176; 178/68

[56] References Cited

UNITED STATES PATENTS

| | | | |
|---|---|---|---|
| 2,894,254 | 7/1959 | Mork | 340/347 DA |
| 2,916,209 | 12/1959 | Adamson et al. | 340/347 DA |
| 2,932,017 | 4/1960 | Prince | 340/347 DA |
| 3,454,943 | 7/1969 | Brown | 340/347 DA |
| 3,469,253 | 9/1969 | Hunt | 340/347 DA |
| 3,560,957 | 2/1971 | Miura et al. | 340/347 DA |
| 3,569,959 | 3/1971 | Arase et al. | 340/347 DA |
| 3,579,232 | 5/1971 | Girard et al. | 340/347 DA |
| 3,603,977 | 9/1971 | Sabo et al. | 340/347 DA |
| 3,754,233 | 8/1973 | Sutherland | 340/347 DA |

OTHER PUBLICATIONS

Crawforth, Second Generatio Toll–Quality PCM Carrier Terminal, GTE Automatic Electric Technical Journal, vol. 13, No. 2, Apr. 1972, p. 66–77.
Schmid, "Electronic Analog/Digital Conversions," Van Nostrand Reinhold Co., 7/1971, pp. 211–216.
Crawforth, "Second Generation Toll–Quality PCM Carrier Terminal," GTE Automatic Electric Technical Journal vol. 13, No. 2, Apr. 1972 pp. 66–77

*Primary Examiner*—Thomas J. Sloyan
*Attorney, Agent, or Firm*—Charles Scott Phelan

[57] ABSTRACT

Digital character signals are split into at least two bit groups of different binary significance. The first and most significant of the bit groups is registered and periodically sampled for conversion in a resistor network to an analog format. The bits of the second, or least significant, bit group are utilized to produce a signal train including in a character time a number of pulses determined by the value of the second bit group and which pulses are approximately evenly located in the interval of the character. Each pulse of the train, as it occurs, momentarily augments the most significant bit group.

One embodiment is shown in which the signal train produced is successive overflow carries from a high speed accumulation operation initially utilizing the least significant bit group and a starting character and thereafter using the least significant bit group and the immediately preceding accumulation sum.

In another embodiment the signal train is produced by a binary rate multiplier, and the least significant bit group is employed to select one of the plural multiplier output frequencies.

Embodiments utilizing time compression are also shown.

21 Claims, 7 Drawing Figures

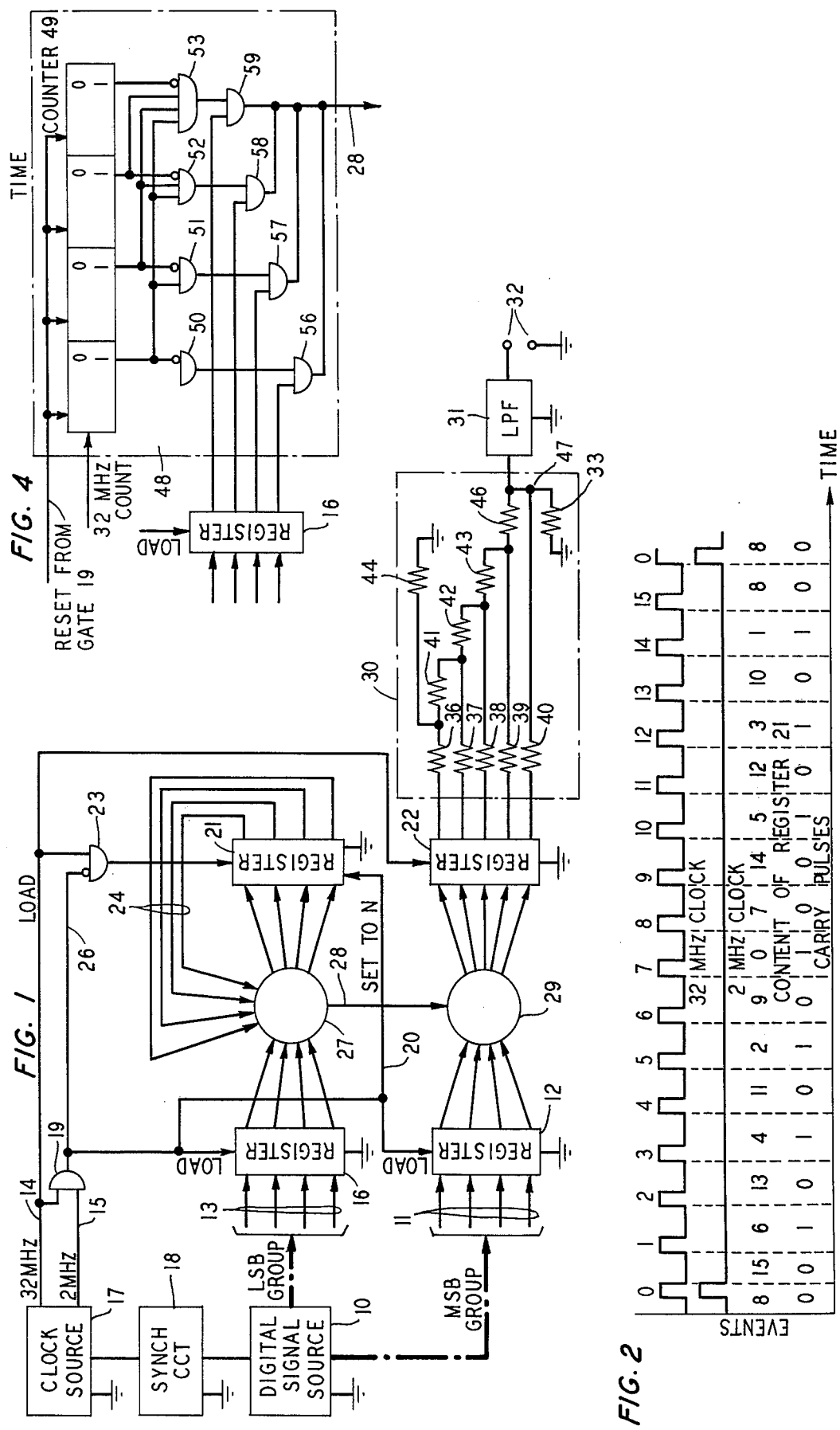

DIGITAL-TO-ANALOG CONVERTER WITH DIGITALLY DISTRIBUTED AMPLITUDE SUPPLEMENT

This is a continuation, of application Ser. No. 421,678 filed Dec. 4, 1973, abandoned.

BACKGROUND OF THE INVENTION

1. Field of the Invention

This invention relates to a digital-to-analog converter and it relates, in particular, to such converters for producing a so-called baseband analog signal.

2. Description of the Prior Art

In the copending application of J.C. Candy Ser. No. 412,296, filed Nov. 2, 1973, now U.S. Pat. No. 3,893,102, entitled "Digital-to-Analog Converter Using Differently Decoded Bit Groups," and assigned to the same assignee as the present invention, a digital-to-analog converter is taught which can be called a time-controlled, amplitude-supplementing type of converter. In that converter the most significant bit group of a digital character is employed to produce a corresponding analog signal. The least significant bit group of the same character is employed to determine a time during the character interval at which to increment the most significant bit group and thereby supplement the analog output signal amplitude. It has been found, however, that the resulting analog output signal train produced by a succession of digital characters includes the amplitude modulation effects of both bit groups and a width modulation effect due to the least significant bit group. The latter modulation introduces a noise signal component within the desired baseband analog signal band and is therefore objectionable.

Pulse width modulation noise of the type just mentioned occurs at times when the baseband signal is changing and is relatively insignificant for constant signals. It has been found that the energy content of the width modulation noise increases with frequency across the baseband being used. Thus, the noise is not as troublesome in video signal systems as it is in audio signal systems because the integrating effect of the human eye, which effect has no counterpart in the ear, suppresses the high frequency noise. However, both high and low frequency noise in the audio band are substantially equally audible.

STATEMENT OF THE INVENTION

In accordance with the present invention, a digital-to-analog converter of the time-controlled, amplitude-supplementing type, sometimes called an interpolating converter, causes the amplitude supplementing of the analog output signal to be produced approximately symmetrically within each digital character interval. To the extent that plural amplitude supplements are needed with respect to a single character, they are distributed over different parts of the character interval in a digital operation controlled by the least significant bit group of the character.

In one embodiment of the invention, the amplitude supplementing is implemented by a high speed accumulation in which the least significant bit group of a character is recurrently accumulated into a predetermined number. The overflow carry ONE or ZERO is added to the most significant bit group of the same character, and the resulting sum is sampled at the rate of the least significant bit group accumulations for conversion to analog form in a resistor network.

Another embodiment of the invention employs the least significant bit group of a digital character for selecting an output frequency of a binary rate multiplier, and pulses of the selected output are added to the most significant bit group of the same character as indicated for the first embodiment.

BRIEF DESCRIPTION OF THE DRAWING

A more complete understanding of the invention and the various features, objects, and advantages thereof may be obtained from a consideration of the following detailed description in connection with the appended claims and the attached drawing in which:

FIG. 1 is a simplified schematic diagram of a digital-to-analog converter in accordance with the present invention;

FIG. 2 is a family of timing diagrams illustrating the operations of the converter of FIG. 1; and FIGS. 3 through 7 are simplified partial schematic diagrams illustrating modifications of the converter of FIG. 1.

DETAILED DESCRIPTION

Figure 3:
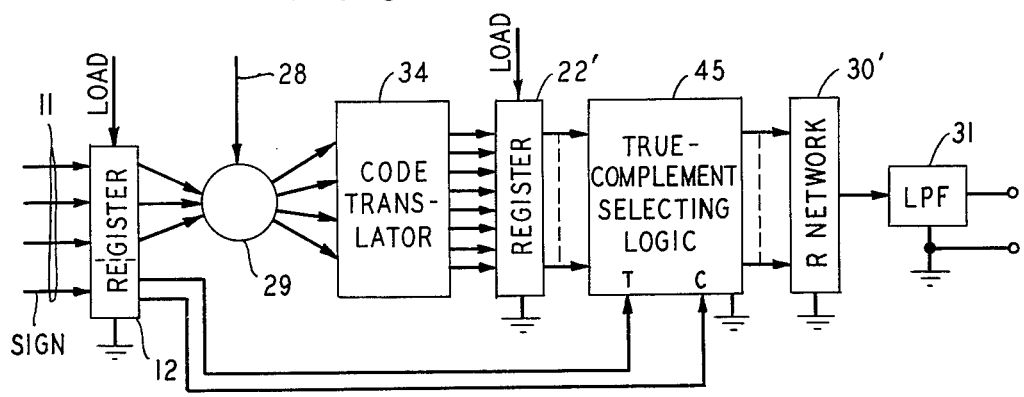

In FIG. 1 a digital signal source 10 supplies successive digital signal characters in bit-parallel fashion. Each character is divided into at least two bit groups, and in the illustrative embodiment the most significant bit (MSB) group is applied by way of circuits 11 to different stage inputs of a register 12. Similarly, the least significant bit (LSB) group of each character is applied by a group of circuits 13 to different stage inputs of another register 16. In each bit group, and in the corresponding one of the two registers, the most significant bit position is at the bottom (as illustrated in FIG. 1) and the other bit positions are in successively higher positions (as illustrated) in decreasing orders or significance in the pulse code arrangement used for the digital characters. A simple binary code is assumed for the illustrative embodiment.

The proportion of the bits included in each bit group must be determined for a particular application as a compromise between the speed of circuit operation and the complexity of a resistor network, to be further discussed, which is utilized for combining digital signals from various binary order positions into a single analog output signal. It has been found for the illustrative embodiment, i.e., a digital-to-analog converter for either voice or video signals in a telephone system, that an equal division between the most significant and least significant bit groups is advantageous.

A further output of the digital signal source 10 is employed for synchronizing a clock signal source 17 as schematically represented by a synchronizing circuit 18. Synchronization is advantageously achieved by utilizing the circuit 18 to recover digital signal timing for application to the clock source 17. The latter source has on a lead 15 a first output at the character rate of digital signals provided by source 10, and this output is advantageously at a 2-MHz rate as illustrated in the drawing. That output is coupled through a coincidence gate, such as the AND gate 19, as a load enabling signal to the registers 12 and 16. Gate 19 produces a high output signal in response to a coincidence of high input signals. The output signal from gate 19 enables input gates (not separately shown) at the various stages of the registers to allow the respective bit groups from source 10 to overwrite the contents of the respective registers. The same output of gate 19 is also coupled by way of a lead 20 to set a predetermined number N into a further register 21 by means of wired setting connections not separately shown in the drawing. For reasons that will become evident, the number N is preferably equal to half the number of digital steps in the full digital number range represented by the number of bits in the least significant bit group provided by source 10. In other words, where four bits are provided, as shown in FIG. 1, sixteen digital steps are represented, a full count would be equal to 16, and N is therefore advantageously selected to be 8.

Clock source 17 has on a lead 14 a second synchronized output at a rate which is sufficient to allow a desired number of digital accumulations, as will be subsequently described, within one character time of signals provided by source 10. A character time is the time interval that a particular character is present in the registers 12 and 16. In FIG. 1 this clock output is advantageously provided at the 32-MHZ rate. In general, however, the number of accumulations employed in the converter is equal to the number of digital steps that can be signaled by the full digital number range represented by the number of bits in the least significant bit group. The 32-MHz clock signal is supplied as one input to the AND gate 19 and is also utilized as a load enabling input for the register 21 and for an additional register 22. This enabling input to the register 21 is coupled by way of an AND gate 23 which also has an inverting input by way of a lead 26 from the output of gate 19 so that the bit-parallel input to register 21 is inhibited during each characterloading clock time when the output of gate 19 is high. The inhibit prevents interference by the bit parallel input with the presetting to N.

FIG. 2 is a timing diagram of various events in the operation of the converter of FIG. 1. Illustrated in the figure are voltage pulse events in the synchronized 2-MHz and 32-MHz outputs of the clock source 17. It can be seen there that each 2-MHz clock pulse occurs in time coincidence with each number 0 pulse of the 32-MHz clock pulse train. In other words, sixteen of the more frequent clock pulses are provided in each character time of the signals provided from source 10.

Respective stage outputs of register 16 are applied to addend inputs of a digital parallel adder 27 which receives as augend inputs the respective stage outputs of the register 21. Four sum bit outputs of the adder 27 are applied to respective stage inputs of the register 21 and an overflow carry output appears on a lead 28. The adder 27 can be of any suitable digital type which receives multibit inputs in parallel and produces multibit outputs. One such adder is the Texas Instruments arithmetic logic unit SN74S181 which appears at pages 23 through 26 in the Texas Instruments pamphlet CC-408 71123-62-HI entitled "New Schottky TTL for Design Engineers."

When the converter circuit of FIG. 1 is initialized, the register 21 is set to the binary 8 state, as previously described, at the time of the initial 32-MHz clock pulse number 0. The output of gate 23 prevents interference with that presetting operation by the bitparallel inputs to the register 21 from the adder 27. Outputs of register 16 and 21 are applied continuously to the adder 27, and that adder operates continuously to provide sum bits to inputs of register 21. The sum formed is not entered into register 21 until a succeeding clock pulse time, but overflow carries are applied by way of the lead 28 to a further parallel digital adder 29 as soon as they are generated. Such carries are added to the contents of the most significant bit group register 12. This latter addition is advantageously accomplished at the least significant bit position of the adder 29.

FIG. 2 illustrates the manner in which the content of register 21 changes over one character time, and it also indicates the resultant generation of overflow carry pulses which are applied to the lead 28. These illustrations in FIG. 2 are represented for the case of a least significant bit group of 0111 representing the decimal number 7. Thus, at the first number 0 clock pulse, the number 8 is loaded into the register 21 in response to the signal on the lead 20. The same number 8 is, of course, coupled by the leads 24 to the adder 27 so that the binary sum corresponding to decimal number 15 appears at the inputs to register 21 and no carry pulse is provided on the lead 28. Upon the occurence of clock pulse number 1, the number 15 is stored in register 21; and a new sum of 6, modulo-16, is provided by the output of adder 27 at register 21 inputs; and a carry pulse is provided on lead 28. At the time of the clock pulse number 2, register 21 is enabled for loading and takes in the new sum of 6, and the corresponding register output causes the adder 27 to form a further new sum of 13, without a carry, which is available to the inputs of the register 21. Accumulation continues, modulo-16, for the remainder of the character time and generating carry pulses as illustrated in FIG. 2.

It can be seen from FIG. 2 that the carry pulses are distributed across the character time and that the ONEs and ZEROs are distributed evenly with respect to time and are approximately symmetrical with respect to the midpoint of the character time. Thus modulation noise occurs at a high frequency outside the baseband. From the foregoing operation it can be seen that least significant bit groups of lower value from source 10 will produce fewer carries, and bit groups of higher value will produce more carries. Different values of N would cause a shift in the symmetrical axis of the distribution and thus would tend to increase modulation noise. The speed of operation of the converter is limited by the rapidity with which multibit addends and augends can be combined in the adder 27.

Adder 29 in FIG. 1 is of the same type as the adder 27. A 4-bit output is received by adder 29 from most significant bit group register 12 without disturbing the numerical contents of the register. Only the single bit augend provided by lead 28 is necessary. Each carry from adder 27 is added in the adder 29 to the most significant bit group, and the 4-bit sum plus an overflow carry bit output are coupled from the adder 29 to the respective stage inputs of the register 22. Here again the most significant bit position is at the bottom (as illustrated in the drawing) of the register 22 and other bits are arranged in successively higher positions corresponding to decreasing orders of binary significance. The overflow carry bit from adder 29 is supplied to the most significant bit position in register 22. That register samples the output of adder 29 at the time of each of the 32-MHz loading pulses from clock source 17. It is thus apparent that the contents of register 22 represent successive individual sums of the signals provided from register 12 and lead 28 rather than representing a recurrent accumulation as was the case for register 21.

The output of adder 29 increases at the onset of each carry pulse from lead 28 and decreases at the end of each such carry pulse. Thus, the extremes of operation would be the all-ZERO and all-ONE conditions for the least significant bit group in register 16. In the case of an all ZERO least significant bit group, the contents of register 21 would remain unchanged throughout a character time and no carries would be generated. Thus, the output of adder 29 and the content of register 22 likewise remain constant during the full character time. On the other hand, an all-ONE least significant bit group in register 16 would produce a carry pulse on lead 28 during every 32-MHz clock pulse in the character time except during the ninth pulse. Thus, a continuous carry input would be provided except during the ninth interval. Consequently, in any condition for the least significant bit group of characters provided by source 10, the carry signal on lead 28 is always approximately symmetrically and evenly distributed in a time sense with respect to the midpoint of a character time. This represents an essentially high frequency noise component which would be out of baseband and easily filterable.

Furthermore, digital adding operations carried out by adders 27 and 29 can be accomplished quite rapidly. The speed capability is sufficiently greater than the capability of prior art counting-type converters, including the converter of the aforementioned Candy application, to permit operation over the comparatively large amplitude range required for voice frequency systems.

Outputs of register 22 are continuously provided from the respective stages thereof through a resistor ladder network 30 and a low-pass filter 31 to converter output terminals 32. Filter 31 has a cutoff frequency just below a frequency equal to one-half of the rate at which characters are supplied from source 10. Resistances of network 30 are selected to produce output analog signal levels that can be represented by the most significant bit group of a total character from source 10. Various forms of resistor network can be advantageously employed depending upon the particular nature of the conversion which is desired, as outlined in the aforementioned J. C. Candy application. In a linear coding system employing straightforward binary coding, a resistor network of the type illustrated in FIG. 1 is advantageously employed. In this network an output resistor 33 and tap resistors 36 through 40 are provided for coupling the respective outputs of register 22 to corresponding terminals of series-connected divider resistors 41, 42, 43, and 46. An additional tap resistor 44 is connected between ground and the divider end of tap resistor 36. Resistances of each of the tap resistors and of resistors 33 and 44 are advantageously of approximately twice the resistance of each of the other divider resistors. Thus, tap resistors and resistors 33 and 44 are advantageously each 1000 ohms and divider resistors are each 500 ohms, and all are of the plus or minus 1 percent tolerance class. The resistor network output terminal is a terminal 47 at the junction of the output resistor 33 and the most significant tap resistor 40. The various tap resistors are all connected to outputs of register 22 which produce a logical ONE in response to a logic ONE input on the corresponding stage.

FIG. 3 illustrates a modification of the FIG. 1 converter to accommodate a segmented pulse code modulation, or logarithmically, companded signal. Such a signal is often employed for transmission of audio frequency information. In such a signal the most significant bit is a sign bit, remaining bits of the most significant bit group identify one of plural amplitude segments of logarithmically increasing size, and the least significant bit group identifies one of plural equally-sized amplitude intervals within any segment. circuits of FIG. 3 are similar to those for the same purpose described in detail in the aforementioned J. C. Candy application and are, therefore, described here only in outline. Thus, a binary-to-n-out-of-m code translator 34 couples the binary coded output of adder 29 to inputs of the register 22'. In the translated output, $n$ is the number of the least significant of the m translator outputs that are energized to represent any given binary input.

The most significant bit in register 12 is the sign bit and it is, in double-rail logic format bypassed around adder 29, translator 34, and register 22' to control truecomplement selecting logic 45. The latter logic selects either the true or the complement form of register 22' outputs for application to resistor network 30'. Details of one advantageous form for each of translator 34, selecting logic 45, and network 30' are included in the mentioned J. C. Candy application.

FIG. 4 is a modified schematic diagram of a portion of the converter of FIG. 1, and it is modified in regard to the portion utilized to determine, in a digital fashion, the number and distribution of analog amplitude supplements provided in response to the signal pulse train on lead 28. In this embodiment the 32-MHz synchronized clock pulse train from source 17 drives a binary rate multiplier 48 of any convenient type. In the multiplier embodiment illustrated in the drawing, the clock pulse train drives the counting input of a 4-stage counter 49. That counter is reset to the all-ZERO state by each output pulse from gate 19 in FIG. 1. The number of counter stages is equal to the number of bits in the least significant bit group provided, as previously outlined, to the register 16. A binary ONE output of each stage in counter 49 is supplied to an inverting, or inhibiting, input of AND gates 50, 51, 52, and 53, respectively. Each such counter output is also coupled as an enabling input to the corresponding AND gate of all stages in higher binary orders.

Each of the gates 50 through 53 has its output coupled as an actuating input to a different one of a group of frequency-selecting AND gates 56, 57, 58, and 59, respectively. The gates 56 through 59 are enabled by the respective outputs of the least significant bit group register 16 to select different output frequencies from the binary rate multiplier 48 according to the value of the least significant bit group in register 16. As is known to those skilled in the art, a binary rate multiplier of the type described produces output pulse trains in successive character times of duration integrally related to the counting rate in the counter 49 and wherein the pulses are approximately symmetrically distributed across the character time with respect to the midpoint of the character time. Such pulse trains are applied to the lead 28 which supplies the single-bit input to the adder 29 of FIG. 1.

Figure 5:
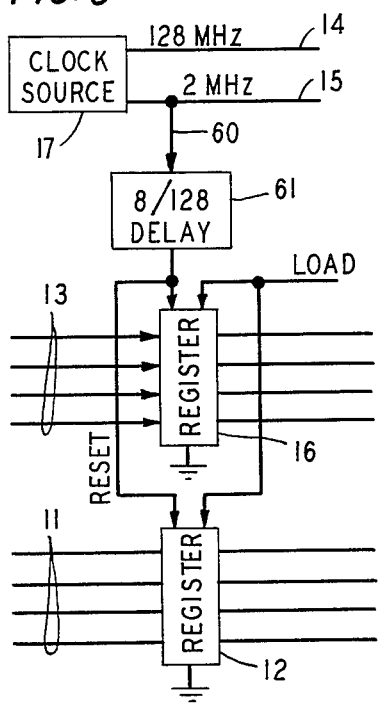
Figure 6:
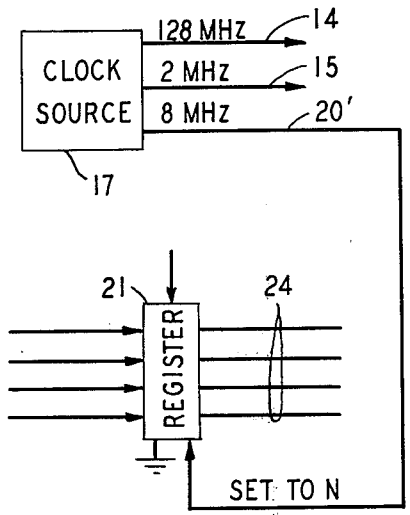
Figure 7:
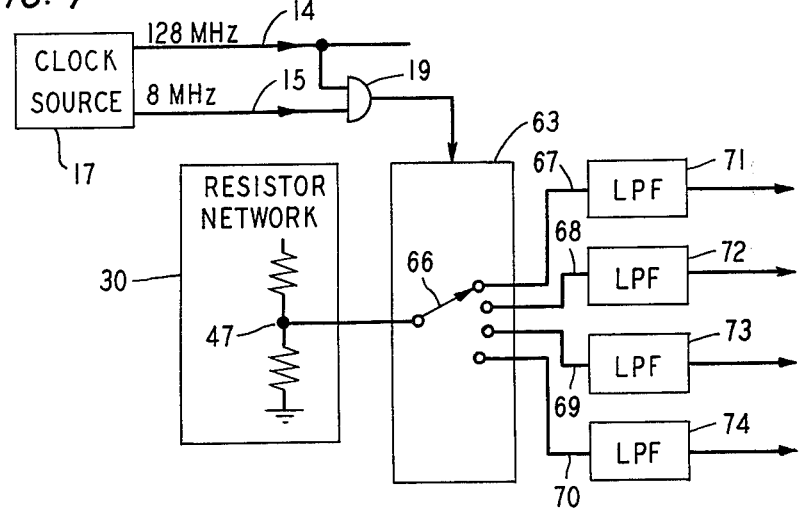

Certain additional advantages become available in interpolation types of digital-to-analog converters of the type described herein and in the aforementioned J. C. Candy application by time compressing operations of the converter. These advantages include the shifting of modulation noise to a higher frequency range in converter applications where such noise is significant. Time compression also enhances the capability for time-sharing a converter among plural time division multiplex signal channels. In addition, time compression can reduce the well-known spectral droop at the high frequency end of the spectrum for situations in which a given digital character persists for the full duration of a digital sample time. FIGS. 5 through 7 in the present application are directed to illustrative modifications of the circuit of FIG. 1 for achieving the aforementioned time compression in different ways.

FIG. 5 is a partial block and line diagram illustrating modifications of the converter of FIG. 1 for time compressing each digital character so that the character time occupies only one-quarter of the sample time. It will be recalled that "character time" is the time that a character is available in registers 12 and 16 of FIG. 1, but "sample time" is here used with reference to the time that a character is available at the output of source 10. The mentioned degree of compression achieves an advantageous reduction in the aforementioned spectral droop characteristic. For interpolation-type converters in which modulation noise is a significant factor, e.g., a converter of the aforementioned Candy application, the compression to one-quarter of the sample time was found to produce adequate noise reduction; and further significant reduction in noise was achieved up to compressions as extensive as one-eighth of the sample time.

In FIG. 5 the output of clock source 17 on lead 14 is increased from 32 MHz to 128 MHz. The clock output on lead 15 is retained at the 2-MHz rate as before; but it is now also supplied from lead 15 by a lead 60 to a delay circuit 61 of any convenient type for achieving a delay of eight periods of the 128-MHz clock, as indicated by the drawing label "8/128 DELAY." The delayed 2-MHz clock is employed for resetting the most significant bit group register 12 and the least significant bit group register 16 to the all-ZERO state. Other connections and operations in FIG. 1 are retained as before so that compressed and spaced character times are produced instead of the character times shown in FIG. 2 which occupy a full sampling time. Thus, in terms of FIG. 2, the diagrams illustrated for "Content of Register 21" and "Carry Pulses" are, for FIG. 5, compressed into a time span occupied by the illustrated 32-MHz clock pulses numbered 0 through 3. However, in that same interval in the embodiment of FIG. 5, there are now sixteen of the 128-MHz clock pulses provided by the clock on the lead 14. In this embodiment, the resetting of registers 12 and 16 introduces a zero analog signal output to filter 31 for three-quarters of each sample time. Thus, the averaged output of the filter 31 will necessarily be at a lower level. However, suitable means, such as the insertion of a gain element (not shown), are advantageously added to make up for this decrease in analog signal amplitude.

FIG. 6 is a partial block and line diagram illustrating a further modification of the embodiment of FIG. 1 and illustrating the use of time compression with the retention of the same character time. That is, sample and character times are equal because each digital representation of a signal sample is retained in the registers 12 and 16 of FIG. 1 for a full sample time. In FIG. 6, the output of clock source 17 on lead 14 is increased to 128 MHz; and the output on lead 15 is retained at 2 MHz, as was the case for FIG. 5. However, in FIG. 6, clock source 17 provides an additional output on lead 20' at an 8-MHz rate which is synchronized so that every fourth pulse of the 8-MHz wave occurs in coincidence with a pulse of the 2-MHz pulse train on lead 15. In the FIG. 6 embodiment the 8-MHz signal on the lead 20', instead of the FIG. 1 load signal on lead 20, provides the "Set to N" signal for the sum register 21. This change in the arrangement of the embodiment of FIG. 1 achieves time compression in a fashion similar to that produced in FIG. 5, but with the addition that each character is repeated four times during a sample interval so that substantially the same information is provided at the output of low-pass filter 31 in FIG. 1 without the need for providing supplemental gain. Other operations of the embodiment of FIG. 1 are the same as described in connection with FIG. 1. It is not necessary to reset adders 27 and 29, but if the FIG. 6 form of time compression is used in circuits using other forms of circuits, e.g., counters, to modify the bit groups, such circuits would also require resetting by the lead 20' signal.

FIG. 7 is a partial block and line diagram illustrating yet another modification of the embodiment of FIG. 1 wherein time compressed characters are employed to allow time-sharing of the digital-analog converter. In this embodiment it is assumed that digital signals provided from source 10 in FIG. 1 are included in a time division multiplex signal train with four, multibit, time slot characters per time division multiplex frame. Thus, time division signal frame times recur at a 2-MHz rate and time slot signal character times recur at the 8-MHz rate. The clock signal from source 17 on lead 14 is 128 MHz as previously indicated for FIGS. 5 and 6. In this case, however, the clock signal provided on lead 15 is raised to the 8-MHz level. Now the output of coincidence gate 19 is employed, in addition to the uses shown in FIG. 1, to control a demultiplexing switch 63 which receives the output from terminal 47 in resistor network 30. Switch 63 can be any convenient type of demultiplexing arrangement known in the art but is, for drawing convenience, schematically illustrated as a 4-position selector switch controlled by the output of gate 19. Analog signals from terminal 47 are applied to a selector arm 66 in the switch 63, and operation of that selector arm steers analog time slot signals from network 30 to respective ones of four corresponding signal paths 67 through 70. Each of those signal paths includes its own low-pass filter 71 through 74, respectively, corresponding to the low-pass filter 31 in the embodiment of FIG. 1. Thus, each of the filters 71 through 74 has a cutoff frequency just below a frequency corresponding to one-half the character rate for its individual signal path, i.e., a cutoff frequency just below 1 MHz for each of the filters 71 through 74.

Although the present invention has been described in connection with particular embodiments thereof, it is to be understood that other modifications and embodiments, which will be apparent to those skilled in the art, are included within the spirit and scope of the invention.

What is claimed is:
1. In combination,
   means for producing an analog signal corresponding in magnitude to each of the values that can be represented by a most significant bit group of a multibit pulse coded character, and
   means, responsive to a less significant bit group of the same character, for temporarily altering said most significant bit group value at an input to said producing means, and thereby altering said magnitude, by a predetermined amount and at plural times during persistence of said character, the total number of alterations in said magnitude, during the persistence time of said character, being determined by the value of said less significant bit group and independent of the value of said most significant bit group, and the duration of each alteration being for a predetermined discrete subinterval of the persistence time of said character.

2. The combination in accordance with claim 1 in which said altering means includes means for distributing said analog signal alterations approximately evenly within the persistence time of said character.

3. The combination in accordance with claim 1 in which a plurality of said characters are provided at a predetermined character recurrence rate and a low-pass filter is coupled to an output of said producing means, said filter having a cutoff frequency at less than half of said character recurrence rate.

4. A digital-to-analog converter comprising a first circuit responsive to a most significant signal bit group of a digitally represented, pulse coded, information, value character for determining in part the magnitude of an analog signal corresponding to said character, each bit of the character representing a quantizing interval of different significance according to a predetermined pulse coding rule, said first circuit producing during the persistence time of each character a first analog signal magnitude corresponding to the value represented by said most significant bit group, a second circuit responsive to a least significant bit group of said character for determining in part the magnitude of the corresponding analog signal, said second circuit including a circuit for producing a signal train including in a character time a number of pulses determined by the value represented by said least significant bit group, any such pulses being approximately evenly distributed in the time interval of the character, and a circuit for coupling said signal train to said first circuit, and means, in said coupling circuit and responsive to each transition between pulse and no-pulse states of the train, for altering the instantaneous value of said most significant bit group, and hence the magnitude of said first analog signal, by an amount equal to the value of a predetermined quantizing interval of the most significant bit group.

5. The converter in accordance with claim 4 in which said signal train producing circuit includes means for effecting in a character time approximately symmetrical distribution of any of said pulses in such character time, and said first circuit includes means for effecting each analog signal alteration in a sense corresponding to the sense of said pulse transition initiating such alteration.

6. The digital-to-analog convertor in accordance with claim 4 in which means are provided for averaging said first signal magnitude and any altered magnitude thereof over the persistence time of each character to produce an average analog magnitude corresponding to the value of such character.

7. The digital-to-analog converter in accordance with claim 4 in which said digital character is a multibit time slot character of a time division multiplex signal train including recurrent signal frame intervals each comprising a plurality of time slot character intervals, and output means are provided which comprise plural signal paths, and means for switching each analog signal provided by said first circuit, and corresponding to a time slot signal of a frame, to a different one of said signal path.

8. A digital-to-analog converter comprising a first circuit responsive to a first signal bit group of a digitally represented, pulse coded, information, value character for determining in part the magnitude of an analog signal corresponding to said character, each bit of the character representing a quantizing interval of different significance according to a predetermined pulse coding rule, said first circuit producing during the persistence time of each character a first analog signal magnitude corresponding to the value represented by said first bit group.

a second circuit reponsive to a second bit group of said character for determining in part the magnitude of the corresponding analog signal, said second circuit including a circuit for producing a signal train including in a character time a number of pulses determined by the value represented by said second bit group, any such pulses being approximately evenly distributed in the time interval of the character, and a circuit for coupling said signal train to the first circuit to alter, in response to each transition between pulse and no-pulse states of the train, the instantaneous magnitude of said first analog signal by an amount equal to the value of a predetermined quantizing interval of the first bit group, and said first circuit comprising a register, a digital adder connected for adding the contents of said register and said signal train, means for sampling the output of said adder, and means for combining different digits of the output of said sampling means to form said first analog signal magnitude and each occurrence of the altered magnitude.

9. The converter in accordance with claim 8 in which each said character includes a sign bit, and said combining means in said first circuit includes means, responsive to the binary signal state of said sign bit, for selecting either the true or the complement form of said sampling means output.

10. The converter in accordance with claim 4 in which said second circuit producing circuit comprises a receiving register, a binary rate multiplier driven at a predetermined signal rate, means responsive to the output of said receiving register for selecting an output frequency of said binary rate multiplier, and means for coupling the selected binary rate multiplier output frequency to said first circuit as said signal train.

11. A digital-to-analog converter comprising a first circuit responsive to a first signal bit group of a digitally represented, pulse coded, information, value character for determining in part the magnitude of an analog signal corresponding to said character, each bit of the character representing a quantizing interval of different significance according to a predetermined pulse coding rule, said first circuit producing during the persistence time of each character a first analog signal magnitude corresponding to the value represented by said first bit group, and a second circuit responsive to a second bit group of said character for determining in part the magnitude of the corresponding analog signal, said second circuit including a circuit for producing a signal train including in a character time a number of pulses determined by the value represented by said second bit group, any such pulses being approximately evenly distributed in the time interval of the character, said producing circuit comprising a receiving register, a sum register, means for periodically loading a predetermined digital number representation into said sum register at the recurrence rate of a plurality of said characters, means for adding the contents of said sum register and the contents of said receiving register recurrently for producing sum and carry output signal bits, means for storing said sum bits into said sum register at a predetermined rate which is greater than said character rate, and means for coupling said adding means carry output to said first circuit as said signal train to alter, in response to each transition between pulse and no-pulse states of the train, the instantaneous magnitude of said first analog signal by an amount equal to the value of a predetermined quantizing interval of the first bit group.

12. The converter in accordance with claim 11 in which said first circuit comprises a register, a digital adder connected for adding the contents of said register and said signal train, means for sampling the output of said adder, and means for combining different digits of the output of said sampling means to form said analog signal.

13. The converter in accordance with claim 11 in which said first circuit includes a register for receiving said first bit group, and said converter comprises in addition means for resetting said first circuit register and said second circuit receiving register to a zero signal state at a predetermined time after the beginning of each character time, the interval between the beginning of each character time and said resetting time being substantially less than the recurrence period for the beginning of successive character times.

14. The converter in accordance with claim 11 in which said periodic loading means includes means for further periodically loading said predetermined digital number representation into said sum register, said further loading occurring at least once between each successive pair of the first-mentioned loading operations at the recurrence rate of said characters.

15. A digital-to-analog converter for converting each of plural, digitally represented, pulse coded, information value characters into analog signals containing substantially the same value information, said converter comprising means, responsive to a first bit group of a character, for producing a pedestal analog signal having a magnitude corresponding to the non-zero coded value information contained in said first bit group of the last-mentioned character.

means, responsive to a remaining group of bits of said last-mentioned character, for producing a pulse train having a number of pulses corresponding to the coded value represented by said remaining group of bits, and means, in said pedestal signal producing means and responsive to said pulse train, for superimposing on said pedestal analog signal a discrete amplitude excursion during each pulse of said pulse train, such excursions having the same amplitude, which amplitude is independent of the coded information value of either said first group of said remaining group.

16. A digital-to-analog converter for converting each of plural, digitally represented, binary coded, information value characters into analog signals containing substantially the same value information, said characters being coded in a positional system wherein each bit position in the character has a different order of significance in a binary number system, said converter comprising means for converting a positionally binary coded, digital bit group of signals to an analog signal having a different, selectable magnitude corresponding to each discrete binary coded value of said bit group of signals, means for coupling to said converting means only a first group of the bits of each said character, means, responsive to a second group of bits of each said character, for controlling said coupling means to increment, for only a subinterval of the persistence time of said character, the value of said first group of the same character in said coupling means at a number of times during the persistence time of such character, said number corresponding to the coded information value of said second bit group.

17. A digital-to-analog converter for converting each of plural, digitally represented, pulse coded, information value characters into analog signals containing substantially the same value information, said converter comprising means, responsive to a least significant bit group of each said character, for changing temporarily the coded value of a most significant bit group of signals from said character at a number of times which is determined by the value of said least significant bit group, means for sampling the output of said changing means at a plurality of times during each character time, said sampling means producing at each such time an output comprising a binary coded, digital, bit group, and means for converting each different output bit group of said sampling means into an analog signal having an amplitude corresponding to the binary coded value of such output bit group.

18. The digital-to-analog converter in accordance with claim 17 in which said converting means comprises means for combining signals corresponding to the binary signal state of each bit in the output of said sampling means with a binary weighting corresponding to the binary coded order of the bit in such group to produce an analog signal having an amplitude corresponding to the coded information value of such sampling means output bit group.

19. A digital-to-analog converter for converting each of plural, digitally represented, pulse coded, information value characters into an analog signal containing in a plurality of signal excursions substantially the same value information as said character, said converter comprising means, responsive to a first bit group of said character, for producing a first analog signal having an amplitude determined by the value of said first group, means, responsive to a second bit group of said character, for producing a pulse train having a number of pulses corresponding to the coded value represented by said second bit group, and means, in said first analog signal producing means and responsive to said pulse train for incrementing and decrementing pulse coded signals of said first bit group in said analog signal producing means for thereby effecting said excursions so that the total number of said excursions is independent of the value of said first bit group and dependent upon the value of said second bit group.

20. In combination, means for producing an analog signal corresponding in magnitude to a value represented by a most significant bit group of a multibit pulse coded character, and means, responsive to a less significant bit group of the same character, for temporarily altering said most significant bit group value at said producing means, and thereby altering said magnitude, by a predetermined amount and at plural times during persistence of said character, the total number of alterations in said magnitude, during the persistence time of said character, being determined by the value of said less significant bit group and independent of the value of said most significant bit group, and the duration of each alteration being for a predetermined discrete subinterval of the persistence time of said character, said altering means comprising means, responsive to both said most significant bit group and said least significant bit group, for producing during each character time a train of positionally coded groups of bits, each group, during each of said plural times, either having said most significant bit group value or having a value differing from said most significant bit group value by one level in the positional coding system of said positionally coded bit groups, and said producing means comprises means, responsive to said bit group train, for producing said analog signal and the altered magnitudes thereof corresponding to said differing bit group values, respectively.

21. A digital-to-analog converter for converting each of plural, digitally represented, pulse coded, information value characters into analog signals containing substantially the same value information, said converter comprising means, responsive to a first bit group of a character, for producing a pedestal analog signal having a magnitude corresponding to the coded value information contained in said first bit group of the last-mentioned character, means, responsive to a remaining group of bits of said last-mentioned character, for producing a pulse train having a number of pulses corresponding to the coded value represented by said remaining group of bits, and means, in said pedestal signal producing means and responsive to said pulse train, for superimposing on said pedestal analog signal a discrete amplitude excursion during each pulse of said pulse train, such excursions having the same amplitude, which amplitude is independent of the coded information value of either said first group or said remaining group, said superimposing means including means for effecting each of said excursions from said pedestal analog magnitude to the next higher level definable by said first bit group and back to said pedestal analog level, the duration of each such excursion being the same and being a function of the number of bits in only said remaining group.

* * * * *